(12) United States Patent
Wei et al.

(10) Patent No.: US 12,199,627 B2
(45) Date of Patent: Jan. 14, 2025

(54) MULTI-PURPOSE COMPENSATION CIRCUITS FOR HIGH-SPEED RECEIVERS

(71) Applicant: Samsung Display Co., Ltd., Yongin-si (KR)

(72) Inventors: Da Wei, Sunnyvale, CA (US); Ali Fazli Yeknami, San Jose, CA (US)

(73) Assignee: Samsung Display Co., Ltd., Yongin-si (KR)

( * ) Notice: Subject to any disclaimer, the term of this patent is extended or adjusted under 35 U.S.C. 154(b) by 479 days.

(21) Appl. No.: 17/694,606

(22) Filed: Mar. 14, 2022

(65) Prior Publication Data

US 2023/0238977 A1 Jul. 27, 2023

Related U.S. Application Data

(60) Provisional application No. 63/302,105, filed on Jan. 23, 2022.

(51) Int. Cl.
*H03K 5/08* (2006.01)
*H03M 1/06* (2006.01)
*H03M 1/10* (2006.01)

(52) U.S. Cl.
CPC ............ *H03M 1/1009* (2013.01); *H03K 5/08* (2013.01); *H03M 1/0617* (2013.01)

(58) Field of Classification Search
CPC ..... H03M 1/1009; H03M 1/0617; H03K 5/08
USPC ......................................................... 455/334
See application file for complete search history.

(56) References Cited

U.S. PATENT DOCUMENTS

| 6,583,667 B1* | 6/2003 | Dasgupta | H03F 3/45197 330/254 |
| 6,618,448 B1* | 9/2003 | Ootuka | H03K 5/007 375/319 |
| 7,236,117 B1* | 6/2007 | Varma | H03M 1/1028 341/122 |
| 7,706,434 B1* | 4/2010 | Farjadrad | H04B 3/32 375/222 |
| 7,881,411 B2* | 2/2011 | Sutton | H03G 3/3052 375/345 |

(Continued)

OTHER PUBLICATIONS

European Search Report for EP Application No. 23152501.5 dated Jun. 20, 2023, 13 pages.

(Continued)

*Primary Examiner* — April G Gonzales
(74) *Attorney, Agent, or Firm* — Lewis Roca Rothgerber Christie LLP

(57) ABSTRACT

A device includes a first compensation circuit configured to adjust an analog front end (AFE) output to generate a first adjusted AFE output, a first data slicer configured to output a first voltage based on the first adjusted AFE output. The first compensation circuit includes a first path between a voltage source and a ground, including a first transistor, a first adjustable current source, a first input voltage node configured to receive the AFE output, and a first output voltage node coupled to the first data slicer, a second path between the voltage source and the ground, including a second transistor, a second adjustable current source, a second input voltage node configured to receive the AFE output, and a second output voltage node coupled to the second data slicer, and a configurable resistance resistor and a configurable capacitance capacitor coupled in parallel across the first path and the second path.

20 Claims, 9 Drawing Sheets

(56) References Cited

U.S. PATENT DOCUMENTS

| | | | | |
|---|---|---|---|---|
| 8,958,501 | B2* | 2/2015 | Nazemi | H04L 25/0296 |
| | | | | 375/316 |
| 9,391,656 | B2* | 7/2016 | Pagnanelli | H04B 1/1081 |
| 9,634,700 | B2* | 4/2017 | Pagnanelli | H04B 1/0475 |
| 9,654,128 | B2* | 5/2017 | Pagnanelli | H03M 1/36 |
| 9,859,907 | B1* | 1/2018 | Li | H03M 1/0678 |
| 2002/0024385 | A1* | 2/2002 | Korn | H03M 1/183 |
| | | | | 330/282 |
| 2004/0222834 | A1* | 11/2004 | Frans | H03K 5/003 |
| | | | | 327/165 |
| 2013/0113450 | A1* | 5/2013 | Tang | G05F 1/10 |
| | | | | 323/283 |
| 2020/0145262 | A1* | 5/2020 | Wang | H04L 27/0002 |

OTHER PUBLICATIONS

Fu, Kuan-Lin et al. "A 64-GB-s PAM-4 Optical Receiver with Amplitude/Phase Correction and Threshold Voltage/Data Level Calibration," IEEE Transactions on Very Large Scale Integration (VLSI) Systems, 28(7), Jul. 2020, pp. 1726-1735.

Shu, Zhou et al. "A 5-13.5 GB-s Multistandard Receiver with High Jitter Tolerance Digital CDR in 40-nm CMOS Process," IEEE Transactions on Circuits and Systems-I:Regular Papers, 67(10), Oct. 2020, pp. 3378-3388.

Yuan, Fei et al. "Design Techniques for Decision Feedback Equalisation of Multi-Giga-Bit-per-Second Serial Data Links: a State-of-the-art review," IET Circuits, Devices, & Systems, 8(2), 2014, pp. 118-130.

* cited by examiner

MULTI-PURPOSE COMPENSATION CIRCUITS FOR HIGH-SPEED RECEIVERS

CROSS-REFERENCE TO RELATED APPLICATION(S)

This application claims priority to U.S. Provisional Patent Application No. 63/302,105 filed on Jan. 23, 2022, which is incorporated herein by reference in its entirety.

FIELD

The present application generally relates to receiver calibration, and more particularly to multi-purpose compensation circuits for high-speed receivers.

BACKGROUND

Receivers such as wireline receivers may be coupled to an analog front end (AFE), and the AFE may be coupled to one or more slicers to translate analog signals from the AFE to a digital signal. However, in most cases, no two slicers are exactly identical due to process variations that may result from manufacturing or fabrication of the slicers. For example, there may be small variations in the attributes of the slicers that ultimately cause the slicers to respond differently. In some instances, these variations can generate incorrect or unintended results. Accordingly, techniques to overcome such variations in the slicers are desired.

SUMMARY

According to some embodiments of the present disclosure, a device may include a first compensation circuit configured to adjust an analog front end (AFE) output to generate a first adjusted AFE output, a first data slicer configured to output a first voltage based on the first adjusted AFE output, a second compensation circuit configured to adjust the AFE output to generate a second adjusted AFE output, and a second data slicer configured to output a second voltage based on the second adjusted AFE output, wherein the first compensation circuit includes a first path between a voltage source and a ground, the first path including a first transistor, a first adjustable current source, a first input voltage node configured to receive the AFE output, and a first output voltage node coupled to the first data slicer, a second path between the voltage source and the ground, the second path including a second transistor, a second adjustable current source, a second input voltage node configured to receive the AFE output, and a second output voltage node coupled to the second data slicer, and a configurable resistance resistor and a configurable capacitance capacitor coupled in parallel across the first path and the second path.

A first electrode of the first transistor may be coupled to the first output voltage node and a gate electrode of the first transistor is coupled to the first input voltage node, and a first electrode of the second transistor is coupled to the second output voltage node and a gate electrode of the second transistor is coupled to the second input voltage node.

A second electrode of the first transistor may be coupled to a first electrode of the configurable capacitance capacitor, and a second electrode of the second transistor is coupled to a second electrode of the configurable capacitance capacitor.

A first electrode of the first adjustable current source may be coupled to a second electrode of the first transistor, and a first electrode of the second adjustable current source is coupled to a second electrode of the second transistor.

A second electrode of the first transistor may be coupled to a first electrode of the configurable resistance resistor, and a second electrode of the second transistor is coupled to the second electrode of the configurable resistance resistor.

The device may further include an AFE configured to generate the AFE output, wherein the AFE output includes a normal output, and an inverted output including an inverted version of the normal output.

The normal output may be provided to the first input voltage node of the first compensation circuit, and the inverted output is provided to the second input voltage node of the first compensation circuit.

The first data slicer may include a first slicer input node coupled to the first output voltage node of the first compensation circuit, and a second data slicer input node coupled to the second output voltage node of the first compensation circuit.

According to other embodiments of the present disclosure, a method for operating a first compensation circuit of a device is described. The method may include operating a device including a first compensation circuit configured to adjust an analog front end (AFE) output to generate a first adjusted AFE output, a first data slicer configured to output a first voltage based on the first adjusted AFE output, a second compensation circuit configured to adjust the AFE output to generate a second adjusted AFE output, and a second data slicer configured to output a second voltage based on the second adjusted AFE output, wherein the first compensation circuit includes a first path between a voltage source and a ground, the first path including a first transistor, a first adjustable current source, a first input voltage node configured to receive the AFE output, and a first output voltage node coupled to the first data slicer, a second path between the voltage source and the ground, the second path including a second transistor, a second adjustable current source, a second input voltage node configured to receive the AFE output, and a second output voltage node coupled to the second data slicer, and a configurable resistance resistor and a configurable capacitance capacitor coupled in parallel across the first path and the second path, wherein the method may include adjusting the first adjustable current source and the second adjustable current source to calibrate the first compensation circuit.

The adjusting the first adjustable current source and the second adjustable current source may include increasing the first adjustable current source and the second adjustable current source in response to a common mode voltage of the first data slicer being too low.

The adjusting the first adjustable current source and the second adjustable current source may include decreasing the first adjustable current source and the second adjustable current source in response to a common mode voltage of the first data slicer being too low.

The adjusting the first adjustable current source and the second adjustable current source may include increasing the first adjustable current source and the second adjustable current source in response to a common mode voltage of the first data slicer being too high.

The adjusting the first adjustable current source and the second adjustable current source may include increasing the first adjustable current source and decreasing the second adjustable current source, or decreasing the first adjustable current source and increasing the second adjustable current source, in response to a first data slicer input node pair mismatch.

The method may further include adjusting the configurable resistance resistor and the configurable capacitance capacitor to shift a frequency response of the first compensation circuit.

According to other embodiments of the present disclosure, a system may include an analog front end (AFE) configured to process an analog input and output an AFE output, a first compensation circuit coupled to the AFE and configured to adjust the AFE output to generate a first adjusted AFE output, a first data slicer coupled to the first compensation circuit and configured to output a first voltage based on the first adjusted AFE output, a second compensation circuit coupled to the AFE and configured to adjust the AFE output to generate a second adjusted AFE output, and a second data slicer coupled to the AFE and configured to output a second voltage based on the second adjusted AFE output, wherein the first compensation circuit includes a first path between a voltage source and a ground, the first path including a first transistor, a first adjustable current source, a first input voltage node coupled to the AFE, and a first output voltage node coupled to the first data slicer, a second path between the voltage source and the ground, the second path including a second transistor, a second adjustable current source, a second input voltage node coupled to the AFE, and a second output voltage node coupled to the first data slicer, and a first configurable resistance resistor and a first configurable capacitance capacitor coupled in parallel across the first path and the second path.

The second compensation circuit may include a third path between a voltage source and a ground, the third path including a third transistor, a third adjustable current source, a third input voltage node coupled to the AFE, and a third output voltage node coupled to the second data slicer, a fourth path between the voltage source and the ground, the fourth path including a fourth transistor, a fourth adjustable current source, a fourth input voltage node coupled to the AFE, and a fourth output voltage node coupled to the second data slicer, and a second configurable resistance resistor and a second configurable capacitance capacitor coupled in parallel across the third path and fourth second path.

A first electrode of the first transistor may be coupled to the first output voltage node and a gate electrode of the first transistor is coupled to the first input voltage node, a second electrode of the first transistor is coupled to a first electrode of the first configurable capacitance capacitor, a first electrode of the second transistor is coupled to the second output voltage node and a gate electrode of the second transistor is coupled to the second input voltage node, and a second electrode of the second transistor is coupled to a second electrode of the first configurable capacitance capacitor.

A first electrode of the first adjustable current source may be coupled to a second electrode of the first transistor, and a first electrode of the second adjustable current source is coupled to a second electrode of the second transistor.

A second electrode of the first transistor is coupled to a first electrode of the first configurable resistance resistor, and a second electrode of the second transistor is coupled to the second electrode of the first configurable resistance resistor.

The AFE output may include a normal output, and an inverted output including an inverted version of the normal output, the normal output is provided to the first input voltage node of the first compensation circuit, and the inverted output is provided to the second input voltage node of the first compensation circuit.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

Figure 1:
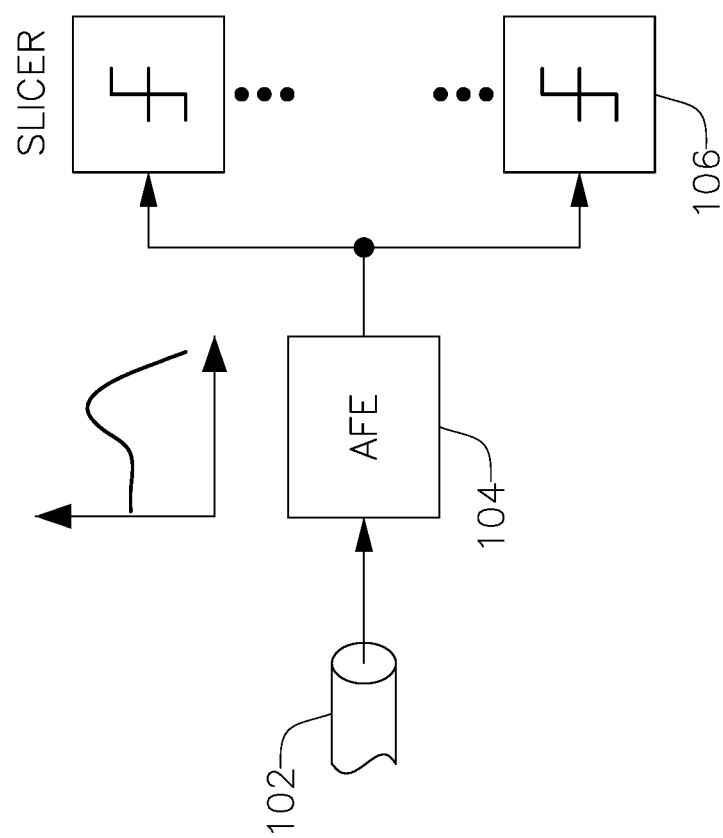
FIG. 1 is a block diagram of an electronic device including an analog front end (AFE) coupled, for example, to another electronic device by a channel, according to various embodiments of the present disclosure.

Embodiments of the present disclosure and their advantages are best understood by referring to the detailed description that follows. Unless otherwise noted, like reference numerals denote like elements throughout the attached drawings and the written description, and thus, descriptions thereof will not be repeated. In the drawings, the relative sizes of elements, layers, and regions may be exaggerated for clarity.

DETAILED DESCRIPTION

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art. Accordingly, processes, elements, and techniques that are not necessary to those having ordinary skill in the art for a complete understanding of the aspects of the present disclosure may not be described.

FIG. 1 is a block diagram of an electronic device including an analog front end (AFE) 104 and slicers 106, that is coupled, for example, to another electronic device by a channel 102 carrying analog data. In certain electronic devices, high speed data may be transmitted over the channel 102 and received by the AFE 104. An AFE 104 may be a circuit that conditions received data signal such as an analog data signal, for example by performing signal amplification, equalization, and/or common mode shifting. In some embodiments, an AFE 104 may include various circuitry known by those having ordinary skill in the art, such as analog amplifiers, operational amplifiers, and filters. An output from the AFE 104 may be coupled to one or more slicers 106, where the data signal that is conditioned by the AFE 104 is translated or converted from an analog signal to a data signal. In some embodiments, the slicer 106 (also referred to as a data slicer) may be an analog-to-digital converter (ADC) that is typically known by those having ordinary skill in the art. Accordingly, a receiver may include many slicers 106 coupled to an AFE 104, for example, one slicer per channel, or other suitable configurations.

Figure 2:
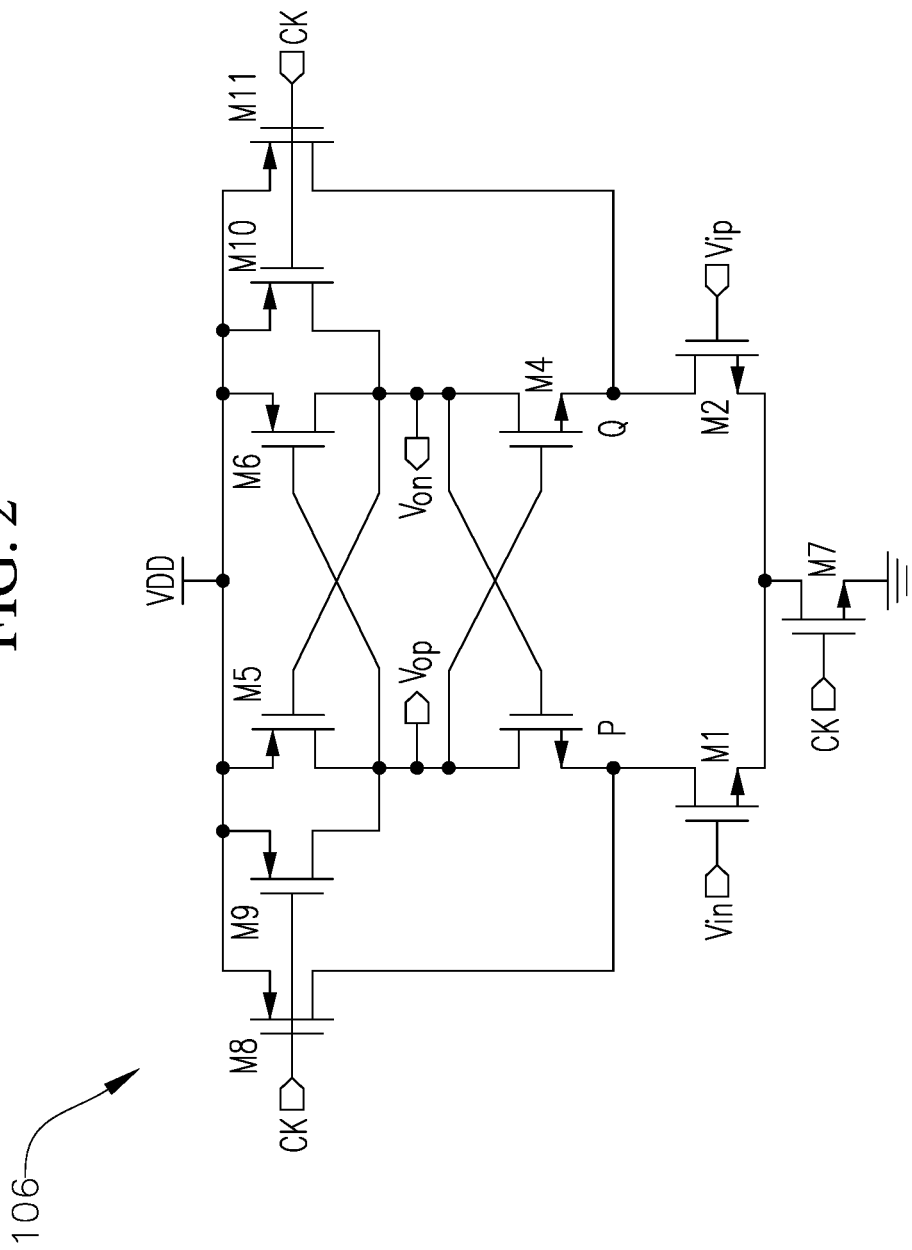
FIG. 2 is a schematic diagram of an example of a slicer circuit, according to various embodiments of the present disclosure.

FIG. 2 is a schematic diagram of an example of a slicer 106. As shown in the schematic, the slicer 106 includes a pair of differential slicer input nodes Vin and Vip coupled to and configured to receive an analog signal from the AFE 104 of FIG. 1, and a pair of differential slicer output nodes Von and Vop configured to output a digital signal. The slicer output nodes Von and Vop may be coupled to other circuitry that utilizes the digital signals. However, this is beyond the scope of the present disclosure and will not be described in more details herein.

Figure 3:
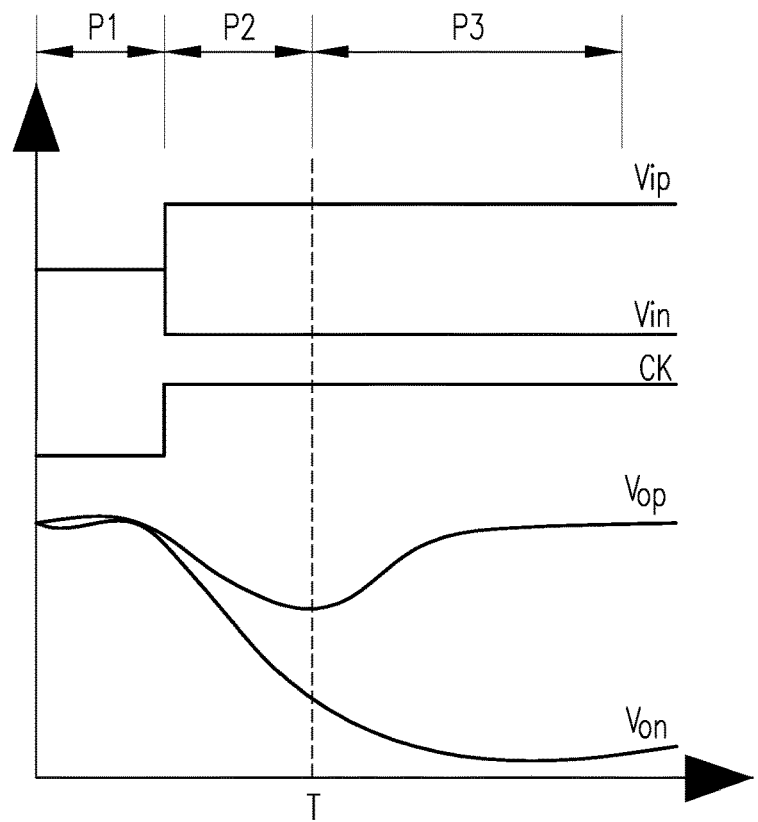
FIG. 3 illustrates a timing diagram corresponding to the example slicer of FIG. 2, according to various embodiments of the present disclosure.

FIG. 3 illustrates a timing diagram corresponding to the slicer 106 illustrated in FIG. 2. The operation of the slicer 106 will now be described. For illustrative and explanation purposes, the operation will be described according to three phases of operation. Accordingly, during a first phase P1, any remaining history from prior cycles (e.g., conditions of the transistors from previous cycles) may be erased by resetting the slicer 106. As shown in FIG. 3, the clock CK is low during the first phase P1, which turns off transistor M7, and turns on transistors M8-M11. Thus, slicer output node Von and Vop are charged up to VDD via transistors M8-M11. Accordingly, the slicer 106 is now reset and ready to start operation as a slicer 106.

During a second phase P2, an analog input voltage is provided to slicer input nodes Vin and Vip. According to an example, voltage Vip>Vin, and the clock CK goes high, thereby causing transistors M7 to turn on and driving current through transistors M1 and M2. When this happens, the voltages at output node Vop and Von begin to lower, but the voltage at output node Von lowers faster than the voltage at output node Vop because the voltage at Vip is greater than the voltage at Vin, as shown in FIG. 3 at the second phase P2.

Moving on the third phase P3, as the voltages at slicer output nodes Vop and Von lower, transistors M5 and M6 begin to turn on and start driving the current. Because the voltage at the output node Von drops faster than the voltage at the output node Vop, transistor M5 is more forward biased (stronger) than transistor M6, and therefore at time T, current through transistor M5 is the same or substantially the same as the current through transistor M1, both of which are greater than the current through transistor M6. At this moment, output voltage node Vop stops decreasing and begins to rise back up to VDD as transistors M5 becomes more forward biased. As the voltage at output voltage node Vop rises, transistor M6 turns off and the voltage at output node Von drops even faster, resulting in an output node Von voltage of 0 and an output node Vop voltage of VDD. Accordingly, the slicer 106 converted an analog input signal to a digital output signal of 0 (ground) and 1 (VDD). It should be noted that the above described slicer circuit and the operation thereof is merely an example of a slicer and that other variations of slicers may be envisaged.

In some embodiments, a plurality of slicers 106 such as the one shown in FIG. 2 may be coupled to an AFE 104 to perform, for example, as an ADC. Furthermore, if each of the plurality of slicers 106 are the same type of slicers, then ideally, all of the slicers 106 should behave in exactly the same manner. However, usually, no two slicers can be exactly the same because of process variations between one slicer and another from the manufacturing processes of the slicers. For example, in some embodiments, even if the voltage at input node Vip is greater than the voltage at input Vin, transistor M1 may be more forward biased (stronger) than transistor M2 due to input pair mismatch resulting from process variation. In other words, the manufacturing specifications affecting the two slicer inputs (e.g., transistors M1 and M2) may be mismatched or non-identical, thus, causing the slicers to generate incorrect or inaccurate outputs.

Figure 4:
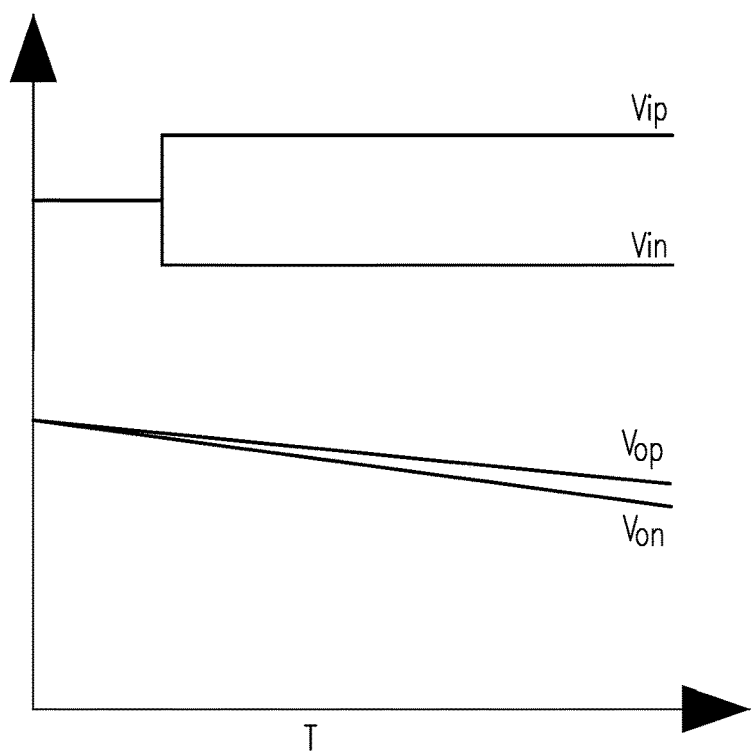
FIG. 4 illustrates a timing diagram corresponding to an example slicer when a common mode voltage is too low, according to various embodiments of the present disclosure.

In other embodiments, process variations may cause both transistors M1 and M2 to be less biased (too weak). Accordingly, if the transistors M1 and M2 are too weak, then the common mode voltage may be too low and the voltages at output nodes Vop and Von may be not pulled low enough to kick start regeneration of transistors M5 and M6 as previously described in the third phase P3. FIG. 4 illustrates an example timing diagram corresponding to a slicer where the common mode voltage is too low. Therefore, the differential input amplification at input voltage nodes Vin and Vip is not large enough to cause transistors M5 and M6 to start regeneration, as can be seen in FIG. 4 where Vop does not rise and Von does not drop as it did in the timing diagram of FIG. 3. Consequently, the slicer 106 may be unable to make a valid decision within one clock cycle as previously demonstrated in FIG. 3.

Figure 5:
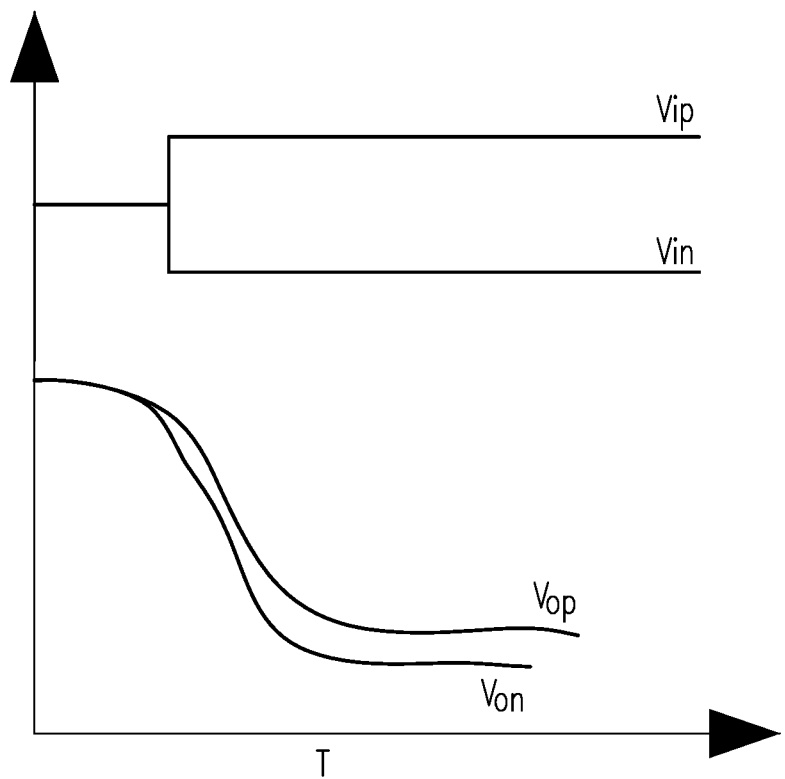
FIG. 5 illustrates a timing diagram corresponding to an example slicer when a common mode voltage is too high, according to various embodiments of the present disclosure.

In another embodiment, process variations may cause both transistors M1 and M2 to be more biased (too strong). Accordingly, if the transistors M1 and M2 are too strong, then the common mode voltage may be too high and the voltages at output nodes Vop and Von may be pulled too low and too fast, and the differential input amplification at input nodes Vin and Vip is not large enough. FIG. 5 illustrates an example timing diagram corresponding to a slicer 106 where the common mode voltage is too high. Consequently, the low output nodes Vop and Von prevent the regeneration pair of transistors M3 and M4 from being strong enough to overcome transistors M5 and M6. Therefore, the slicer enters a meta-stable state and the output is dominated by noise.

Yet in another embodiment, slicers 106 may behave differently depending on the physical location of the slicer 106 on a chip. For example, slicers 106 that are placed at different locations on the chip may experience different loading because of differences in the surrounding area of each of the slicers 106. In other words, a slicer 106 that is located at one area of the chip may be surrounded by a certain type and a certain quantity of circuitry and components, whereas another slicer 106 that is located at another area of the same chip may be surrounded by a different type of and different quantity of circuitry and components. Therefore, even though these slicers 106 have different loading, the shared AFE 104 that is coupled to these slicers 106 are configured to operate based on one frequency response for all slicers. In other words, the AFE 104 is not configured to operate at different frequency responses. Consequently, designing the AFE 104 for the worst case slicer may result in overcompensation for the best case slicer and vice versa. In other words, setting the frequency response based on one slicer may lead to overcompensation or under compensation for the other slicer(s). Thus, it is desirable to provide compensation for the slicer to overcome the above described issues.

Figure 6:
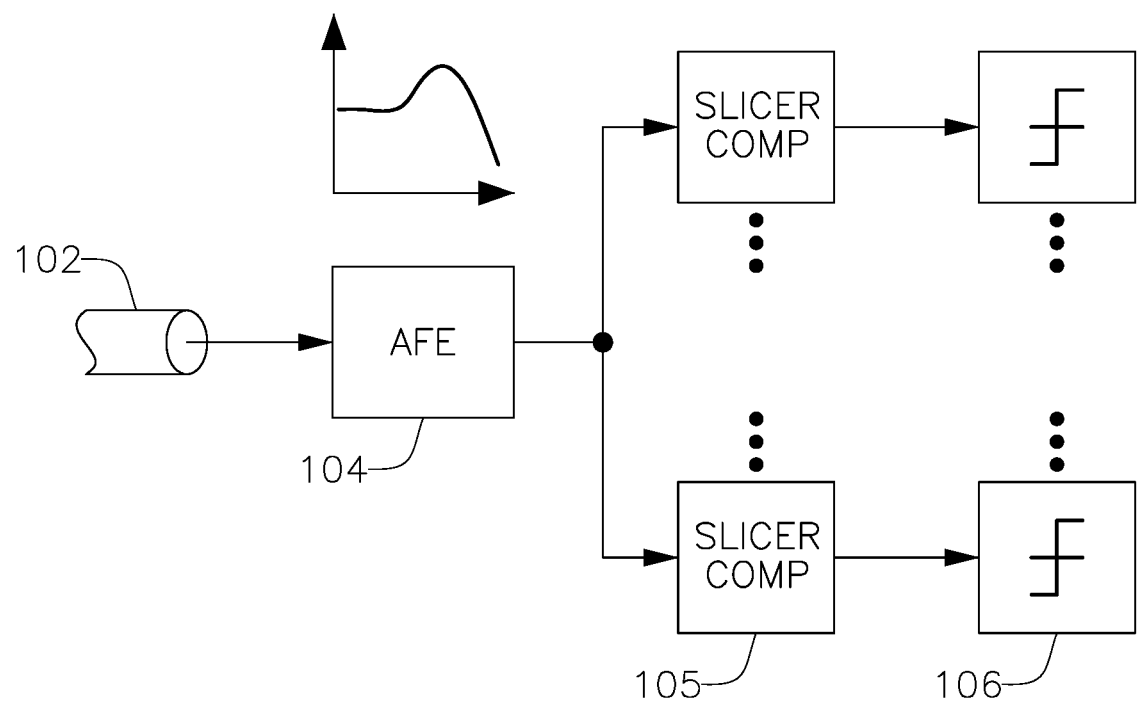
FIG. 6 is a block diagram of an electronic device that includes a slicer compensation circuit between an AFE and every slicer, according to various embodiments of the present disclosure.

According to various embodiments of the present disclosure, a slicer compensation circuit 105 may be included between the AFE 104 and each slicer 106. FIG. 6 is a block diagram of the electronic device shown in FIG. 1 with a slicer compensation circuit 105 between the AFE 104 and each of the slicers 106. Accordingly, each slicer 106 may include a compensation circuit 105 coupled at the input of the slicer 106 such that the input signal from the AFE 104 may be compensated or adjusted to overcome some or all of the issues described above with the slicer 106. In other words, the compensation circuit 105 may be configured or calibrated such that the output signal from the AFE 104 is adjusted to effectively cancel out the effects from the issues realized by each slicer 106, including the input pair mismatch, common mode voltage being too high or too low, and the adjusting the frequency response of the AFE for the slicer 106. Thus, by adjusting the AFE 104 output signal, an adjusted AFE output which is the resulting outcome from the compensation circuit 105, is a digital signal that appears to be unaffected by the aforementioned slicer issues. Accordingly, the slicer 106 may be able to generate a more accurate output.

Figure 7:
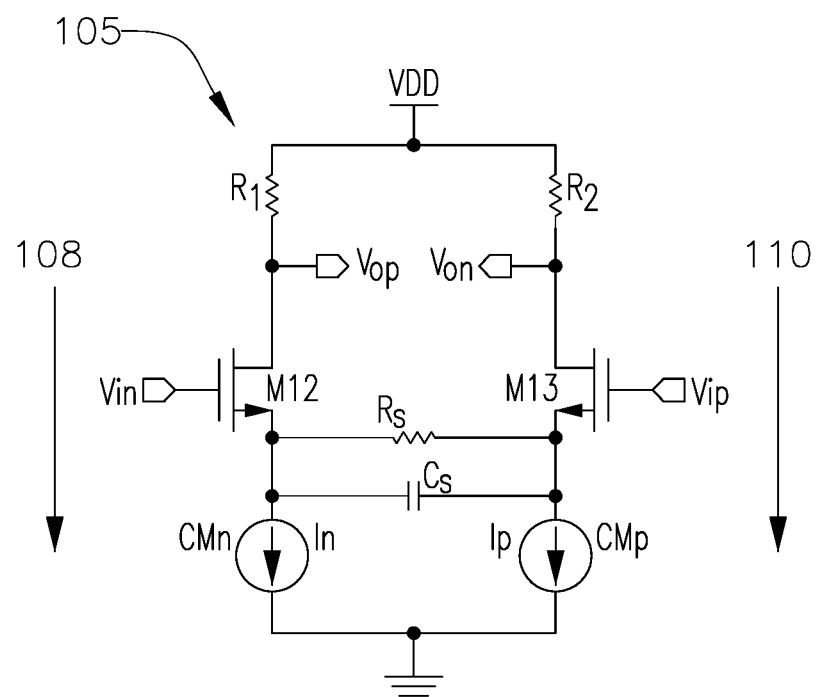
FIG. 7 is a schematic diagram of the slicer compensation circuit, according to various embodiments of the present disclosure.

FIG. 7 is a schematic diagram of a slicer compensation circuit 105, according to various embodiments of the present disclosure. The compensation circuit 105 includes a first path 108 and a second path 110 in parallel with the first path between a voltage source VDD and a ground. The first path 108 may include a first resistor R1, a first transistor M12, a first adjustable current source CMn, a first input voltage node Vin, and a first output voltage node Vop. The second path 110 may include a second resistor R2, a second transistor M13, a second adjustable current source CMp, a second input voltage node Vip, and a second output voltage node Von.

According to some embodiments, one end of the first resistor R1 may be coupled to the voltage source VDD and the other end of the first resistor R1 may be coupled to a drain of the first transistor M12. The source of the first transistor M12 may be coupled to one end of the first adjustable current source CMn, and the other end of the first adjustable current source CMn may be coupled to ground. The gate of the first transistor M12 is the first input voltage node Vin and may be coupled to an output of the AFE 104. For example, the AFE 104 may have a normal output and an inverted output, wherein the inverted output is an inverted version of the normal output. Here, the first input node Vin may be coupled to the inverted output of the AFE. In some embodiments, the drain of the first transistor M12 may be the first output voltage node Vop, which may be coupled to a first input node of a slicer 106 (Vip of FIG. 2).

In some embodiments, one end of the second resistor R2 may be coupled to the voltage source VDD and the other end of the second resistor R2 may be coupled to a drain of the second transistor M13. The source of the second transistor M13 may be coupled to one end of the second adjustable current source CMp, and the other end of the second adjustable current source CMp may be coupled to ground. The gate of the second transistor M13 is the second input voltage node Vip and may be coupled to an output of the AFE, for example the normal output of the AFE. In some embodiments, the drain of the second transistor M13 may be the second output voltage node Von, which may be coupled to a second input node of a slicer (Vin of FIG. 2).

In some embodiments, the first and second transistors M12, M13 may be a metal oxide silicon field effect transistor (MOSFET) or other similar transistor and may be an N-type or a P-type transistor such as an NMOS or a PMOS. In some embodiments, a configurable resistance resistor Rs is coupled in parallel with a configurable capacitance capacitor Cs across the source of the first transistor M12 and the source of the second transistor M13. In some embodiments, the configurable capacitance capacitor Cs may be implemented as a MOS capacitor, wherein the capacitance can be changed or adjusted by tuning the gate voltage of the MOS capacitor. In some embodiments, the configurable resistance resistor Rs can be implemented as a bank of MOSFETs, wherein the resistance can be changed or adjusted by turning on more or less segments of the bank of MOSFETs (e.g., a selected number of banks depending on the desired resistance).

The operation of the compensation circuit 105 will now be described. According to various embodiments of the present disclosure, the compensation circuit of FIG. 7 may be implemented to compensate for the input pair mismatch that may result in a slicer 106. To compensate for the input pair mismatch in a slicer 106, a negative DC offset may be applied at the input of the slicer 106. Thus, the first adjustable current source CMn and the second adjustable current source CMp may be adjusted to change current $I_n$ through the first current source CMn and to change current $I_p$ through the second current source CMp, which changes the voltage levels at compensation circuit output voltages nodes Vop and Von. This negative DC offset may then be applied to the input nodes of the slicer 106. For example, where $I_B$ is the bias current and ID is the difference current:

$$I_n = I_B + I_D, \text{ and } I_p = I_B - I_D$$

$$Vop = VDD - (I_B + I_D)R, \text{ and } Von = VDD - (I_B - I_D)R$$

$$Vop = (VDD - I_B R) - I_D R, \text{ and } Von = (VDD - I_B R) + I_D R$$

Therefore, a DC offset of $2 \times I_D R$ may be realized at the output nodes Vop and Von of the compensation circuit 105. Therefore, by selectively adjusting the current of the first adjustable current source CMn and the second adjustable current source CMp, a properly determined DC offset may be realized at the slicer input nodes Vin and Vip, which are the gates of transistors M1 and M2, thereby effectively canceling the slicer input-referred offsets.

Figure 8:
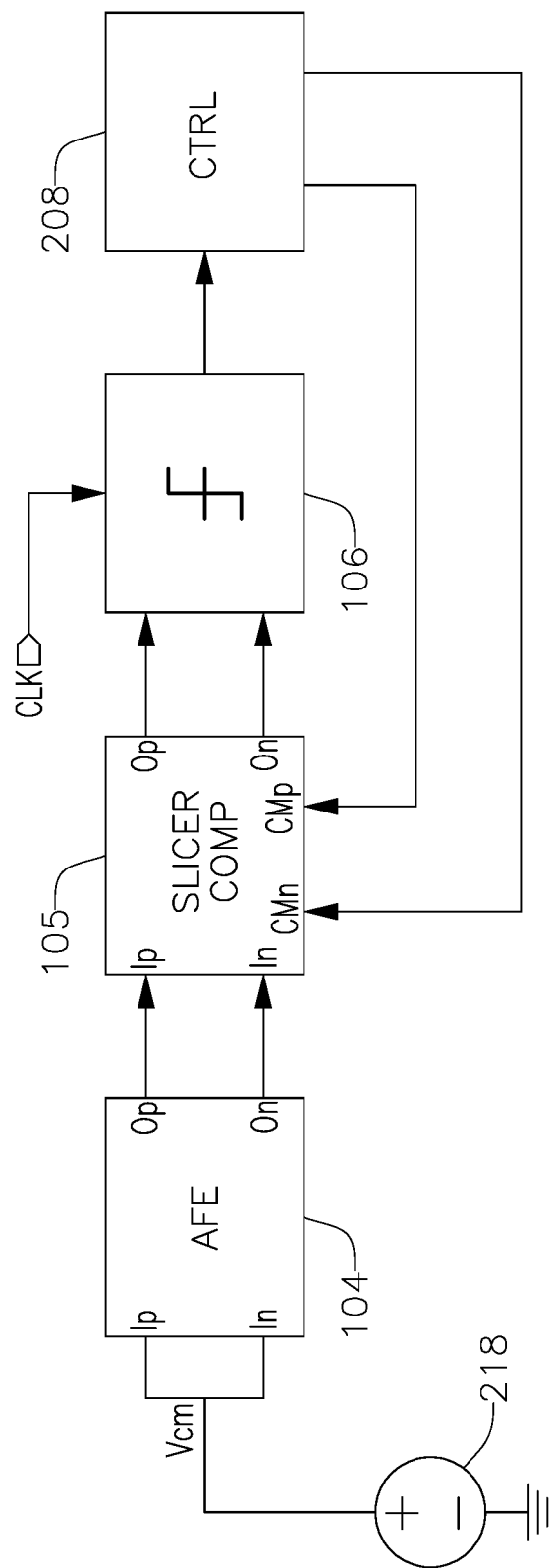
FIG. 8 is a block diagram of an example configuration for calibrating the compensation circuit, according to various embodiments of the present disclosure.

In some embodiments, the current of the first adjustable current source CMn and the second adjustable current source CMp may be set or calibrated by connecting a known common mode voltage 210 at the inputs of the AFE 104, and then connecting the compensation circuit 105 to the AFE 104, and connecting the slicer 106 to the compensation circuit 105 as shown in FIG. 8. The slicer 106 may be coupled to a controller 208, which measures the output from the slicer 106 and adjusts the first adjustable current source CMn and the second adjustable current source CMp based on the output values from the slicer. For example, the common mode voltage 210 inputs a differential voltage of zero to the AFE 104, and therefore puts the slicer 106 in a metastable state where the output of the slicer 106 is based on internal noise and internal offset. Therefore, the expectation is that the output should generate approximately the same number of 1s and 0s. However, if the controller 208 receives more 1s than 0s, then the compensation circuit output node Vop is too high, and therefore the first adjustable current source CMn is increased (e.g., by one step), and the second adjustable current source CMp is decreased (e.g., by one step) to lower the DC offset by the compensation circuit output node Vop while keeping the common mode value unchanged. On the other than, if the controller receives more 0s than 1s, then the compensation circuit output node Von is too high, and therefore the first adjustable current source CMn is decreased (e.g., by one step), and the second adjustable current source CMp is increased (e.g., by one step) to lower the DC offset by the compensation circuit output node Von while keeping the common mode value unchanged. When the controller 208 receives the same or substantially the same amount of 1s and 0s, then the compensation circuit is properly calibrated to compensate for the input pair mismatch.

According to other embodiments of the present disclosure, the compensation circuit 105 of FIG. 7 may be implemented to adjust the common mode of a slicer 106 if the common mode is too high or too low. As explained above, the common mode of the slicer 106 may be changed by adjusting the current of the first adjustable current source CMn and the second adjustable current source CMp. However, in this case, both current $I_n$ through the first adjustable current source CMn and the current $I_p$ the second adjustable current source CMp may be adjusted by the same or substantially the same amount. For example, to decrease the output common mode voltage, both $I_n$ and $I_p$ may be increased, and to increase output common mode voltage, both $I_n$ and $I_p$ may be decreased.

Figure 9:
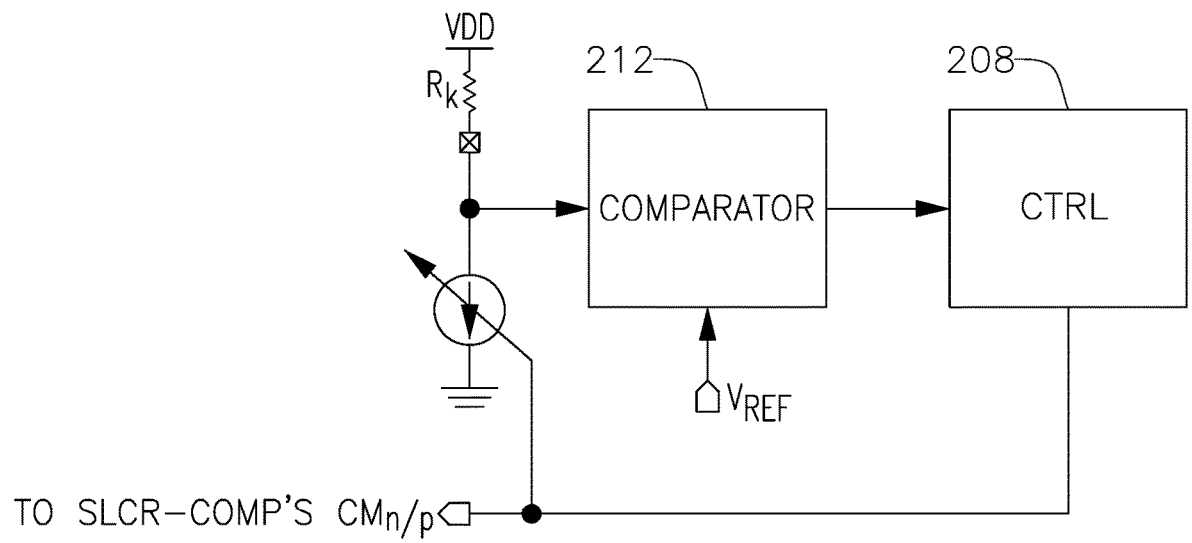
FIG. 9 is a block diagram of an example circuit for calibrating the compensation circuit, according to various embodiments of the present disclosure.

In some embodiments, to calibrate the common mode voltage, a replica of the first adjustable current source CMn and the second adjustable current source CMp may be implemented to draw current from a known resistor Rk (e.g., a resistor that may be on the chip or off the chip). FIG. 9 is a block diagram of an example circuit for calibrating the common mode voltage. As illustrated, the replica current source CMn/p may be coupled to a comparator 212, and a controller 208 may be coupled to the comparator 212 to adjust the replica current source CMn/p based on the output from the comparator 212. By adjusting the replica current source CMn/p, the first adjustable current source CMn and the second adjustable current source CMp are also adjusted accordingly. Here, because both first adjustable current source CMn and second adjustable current source CMp are adjusted by the same amount, the same replica current source CMn/m may be implemented to adjust both first and second adjustable current sources CMn and CMp.

Thus, to calibrate, the voltage at the drain of the replica current source is compared against a reference voltage Vref. If the controller receives more 1s and 0s, then the current source is drawing insufficient current, and therefore the current of the replica current source CMn/p may be increased, and vice versa. If the controller receives the same or substantially the same number of 1s and 0s, then the replica current source CMn/p is properly calibrated for common mode voltage, and consequently, first adjustable current source CMn and the second adjustable current source CMp are also considered to be properly calibrated.

Figure 10:
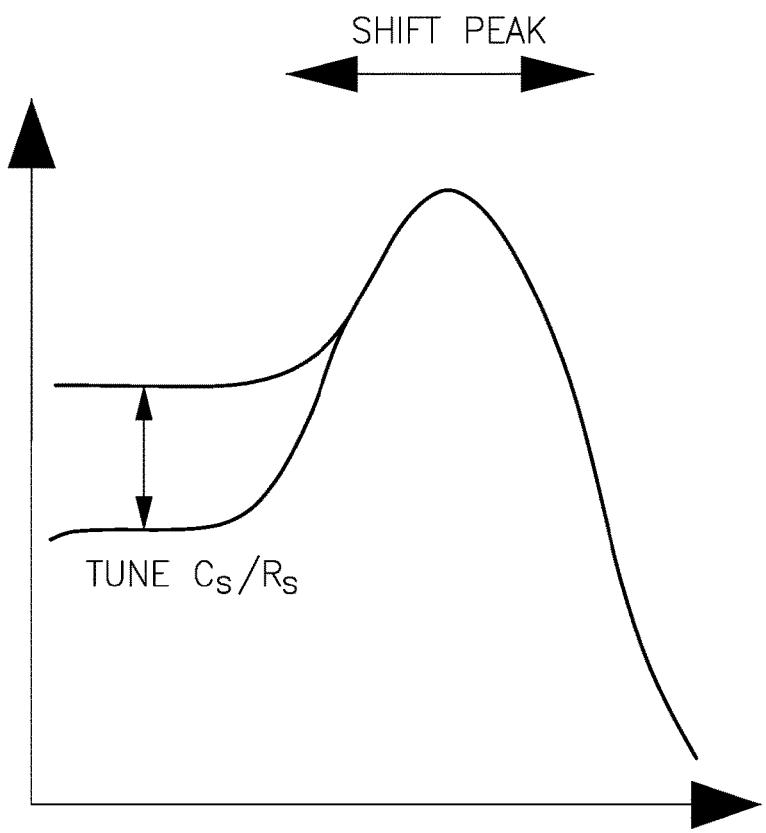
FIG. 10 is a graph illustrating an example frequency response by the compensation circuit, according to various embodiments of the present disclosure.

According to other embodiments of the present disclosure, the compensation circuit 105 of FIG. 7 may be implemented to adjust the frequency response of the compensation circuit 105, and therefore the equalization profile of the slicer 106 by adjusting the resistance of the configurable resistance resistor Rs and the capacitance of the configurable capacitance capacitor Cs. By adjusting these values, the peak of the equalization profile may be shifted, for example, to the left or to the right, as illustrated in FIG. 10. Therefore, by adjusting the resistance of the configurable resistance resistor Rs and the capacitance of the configurable capacitance capacitor Cs in each compensation circuit 105 that is coupled to a slicer 106, the frequency response of the compensation circuit 105 may be adjusted so that they correspond with the frequency response of all of the slicers 106, even though the slicers are located at physically different locations on a chip.

Figure 11:
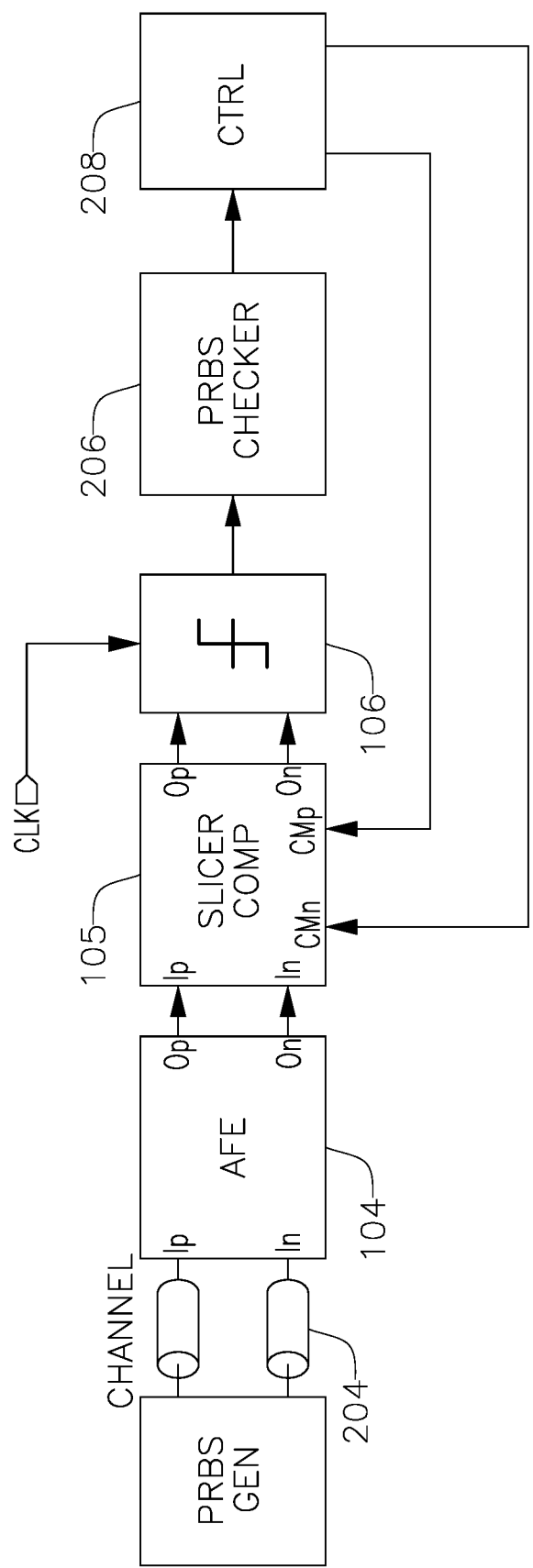
FIG. 11 is a block diagram of an example configuration for calibrating the compensation circuit, according to various embodiments of the present disclosure.

FIG. 11 is a block diagram of an example calibration circuit that may be implemented to adjust the values of the resistance of the configurable resistance resistor Rs and the capacitance of the configurable capacitance capacitor Cs. As shown, a pseudo-random bit stream (PBRS) generator 202 may be used to transmit PBRS data to an AFE 104, for example, over target channels 204 to various physical locations of the slicers 106. The AFE 104 may be coupled to the compensation circuit 105 and the compensation circuit 105 may be coupled to the slicer 106. Thus, to calibrate the compensation circuit 105 by adjusting the resistance of the configurable resistance resistor Rs and the capacitance of the configurable capacitance capacitor Cs, a PRBS checker 206 may be coupled to the output of the slicer 106, and the PRBS checker 206 may be coupled to a controller 208, which may then adjust the resistance of the configurable resistance resistor Rs and the capacitance of the configurable capacitance capacitor Cs of the compensation circuit 105 based on the output from the slicer 106 as read by the PRBS checker 206. In other words, the slicer 106 is operated with a target clock and the PRBS checker 206 samples the slicer 106 output. As the PRBS checker 206 samples the output from the slicer 106, the resistance of the configurable resistance resistor Rs and the capacitance of the configurable capacitance capacitor Cs may be adjusted until a bit error rate (BER) is reduced (e.g., minimized). Once the smallest BER is determined, the calibration of the compensation circuit 105 is complete.

It should be noted that while the present disclosure illustrates the calibration circuit of FIG. 8 and the calibration circuit of FIG. 11 as separate circuits, in some embodiments, the calibration circuits of FIGS. 8 and 11 may be substantially combined so that one or more of the first and second current adjustable sources CMn and CMp, configurable capacitance capacitor Cs, and configurable resistance resistor Rs may be adjusted by the controller 208. Yet, in some embodiments, multiple controllers may be provided, for example, one controller for adjusting the first and second adjustable current sources CMn and CMp, and another controller for adjusting the configurable capacitance capacitor Cs and the configurable resistance resistor Rs, or other combinations thereof.

Figure 12:
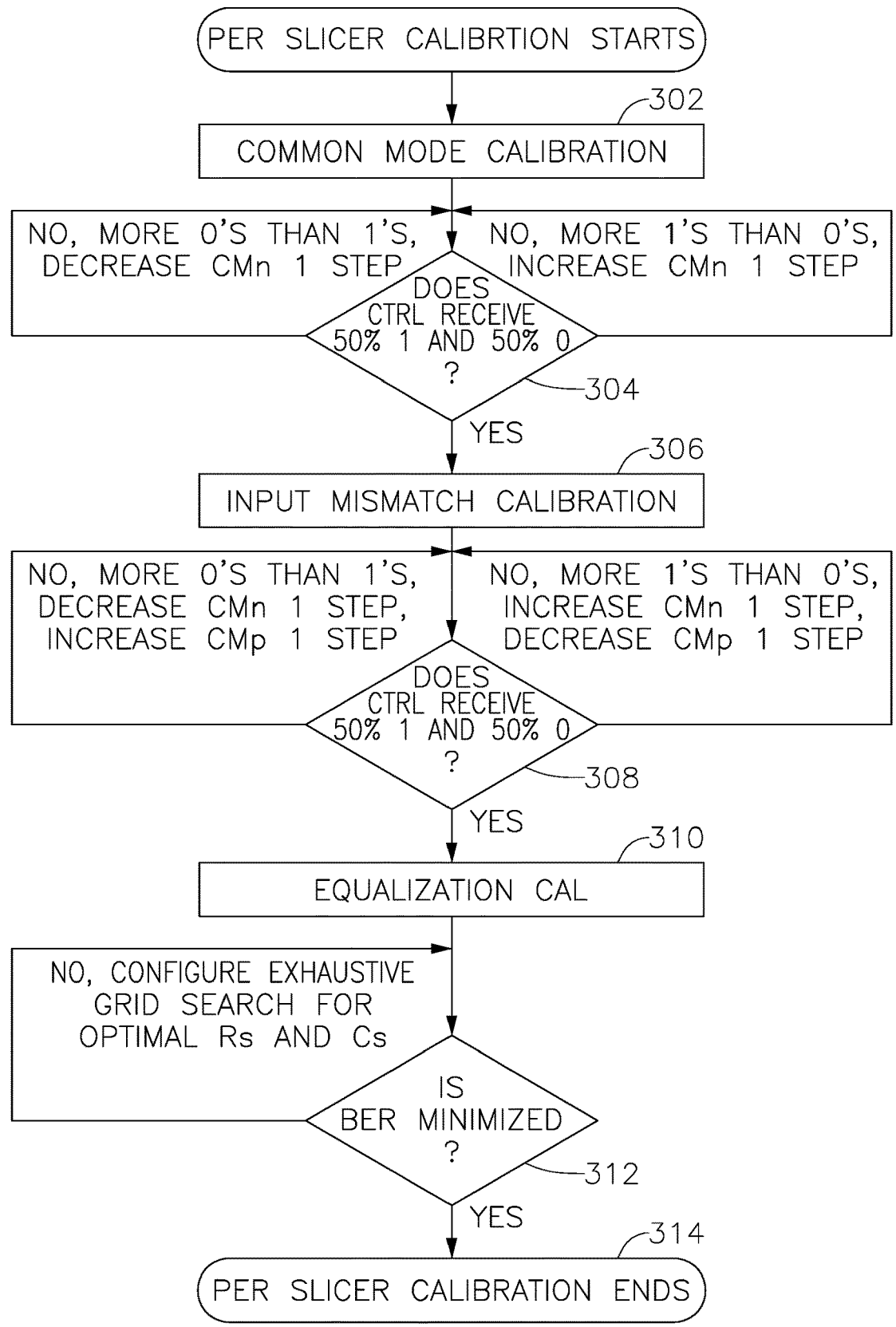
FIG. 12 is a flow chart of an example method for calibrating the compensation circuit, according to various embodiments of the present disclosure.

FIG. 12 is a flow chart of an example method for calibrating the compensation circuit, according to various embodiments of the present disclosure. In some embodiments, the compensation circuit may by the circuit shown in the schematic diagram of FIG. 7. In some embodiments, a compensation circuit may be coupled to the input of every slicer 106. Thus, for example, if a particular chip includes 20 slicers 106, then one compensation circuit 105 may be coupled to the input of each one of the 20 slicers 106.

Because each of the 20 slicers 106 may vary in some manner due to process variations during manufacturing of the slicers 106, each of the slicers may be individually compensated by an individually calibrated compensation circuit 105. The foregoing steps explain an example method for performing such calibration of the compensation circuit 105. However, it should be noted that this is not the only calibration method that may be used and that other calibration methods may be envisaged.

According to a first step, a common mode calibration may be performed on the compensation circuit 105 (302). The compensation circuit 105 may be arranged in a circuit like the one shown in FIG. 9, and the output of the comparator 212 may be read by a controller 208 to determine the ratio of 1s and 0s (304). If there are more 0s than 1s, then the replica current source CMn/p may be decreased, and if there are more 1 s and 0s, then the replica current source CMn/p may be increased. This process may be repeated until the output of the comparator 212 results in about a 50% ratio of 0s to 1s. Then, the calibration process may move on to input pair mismatch calibration (306). Here, the compensation circuit 105 may be arranged in a circuit like the one shown in FIG. 8, and the output of the slicer 106 may be read by a controller 208 to determine the ratio of 1s and 0s (308). If there are more 0s than 1s, then the adjustable current source CMn may be decreased by one step and the adjustable current source CMp may be increased by one step. If there are more 1 s than 0s, then the adjustable current source CMn may be increased by one step and the adjustable current source CMp may be decreased by one step. This process may be repeated until the output of the comparator 212 results in about a 50% ratio of 0s to 1s. Then the calibration process may move on to equalization calibration (310). The compensation circuit 105 may be arranged according to a circuit like the one shown in FIG. 11, and the output of the slicer 106 may be read by a PRBS checker until the BER is reduced or minimized (312). The PRBS checker may continue to read the slicer 106 output while the controller 208 adjusts the values of the resistance of the configurable resistance resistor Rs and the capacitance of the configurable capacitance capacitor Cs. One the reduced or minimized BER is achieved, the calibration of the compensation circuit 105 is finished (314) and the compensation circuit 105 may be implemented with the slicer 106 for use.

Accordingly, a compensation circuit 105 may be calibrated to compensate the slicer 106 for issues that result from process variations such as common mode voltage being too high or too low, or input pair mismatch, as well as issues that result from variations in loading. Thus, such slicer 106 issues may be effectively removed or canceled by a properly calibrated compensation circuit 105 and the slicer 106 will be able to generate and output correct results.

Unless otherwise noted, like reference numerals, characters, or combinations thereof denote like elements throughout the attached drawings and the written description, and thus, descriptions thereof are not repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place.

Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled" refers to one component directly connecting or coupling another component without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

When one or more embodiments may be implemented differently, a specific process order may be performed differently from the described order. For example, two consecutively described processes may be performed substantially at the same time or performed in an order opposite to the described order.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

The electronic or electric devices and/or any other relevant devices or components according to embodiments of the present disclosure described herein may be implemented utilizing any suitable hardware, firmware (e.g., an application-specific integrated circuit), software, or a combination of software, firmware, and hardware, to process data or digital signals. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Circuit hardware may include, for example, application specific integrated circuits (ASICs), general purpose or special purpose central processing units (CPUs) that is configured to execute instructions stored in a non-transitory storage medium, digital signal processors (DSPs), graphics processing units (GPUs), and programmable logic devices such as field programmable gate arrays (FPGAs).

Further, the various components of these devices may be a process or thread, running on one or more processors, in one or more computing devices, executing computer program instructions and interacting with other system components for performing the various functionalities described herein. The computer program instructions are stored in a memory that may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the embodiments of the present disclosure.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Embodiments described herein are examples only. One skilled in the art may recognize various alternative embodiments from those specifically disclosed. Those alternative embodiments are also intended to be within the scope of this disclosure. As such, the embodiments are limited only by the following claims and their equivalents.

What is claimed is:

1. A device comprising:
a first compensation circuit configured to adjust an analog front end (AFE) output to generate a first adjusted AFE output;
a first data slicer configured to output a first voltage based on the first adjusted AFE output;
a second compensation circuit configured to adjust the AFE output to generate a second adjusted AFE output; and
a second data slicer configured to output a second voltage based on the second adjusted AFE output,
wherein the first compensation circuit comprises:
a first path between a voltage source and a ground, the first path comprising a first transistor, a first adjustable current source, a first input voltage node configured to receive the AFE output, and a first output voltage node coupled to the first data slicer;
a second path between the voltage source and the ground, the second path comprising a second transistor, a second adjustable current source, a second input voltage node configured to receive the AFE output, and a second output voltage node coupled to the second data slicer; and
a configurable resistance resistor and a configurable capacitance capacitor coupled in parallel across the first path and the second path.

2. The device of claim 1, wherein
a first electrode of the first transistor is coupled to the first output voltage node and a gate electrode of the first transistor is coupled to the first input voltage node, and
a first electrode of the second transistor is coupled to the second output voltage node and a gate electrode of the second transistor is coupled to the second input voltage node.

3. The device of claim 1, wherein
a second electrode of the first transistor is coupled to a first electrode of the configurable capacitance capacitor, and
a second electrode of the second transistor is coupled to a second electrode of the configurable capacitance capacitor.

4. The device of claim 1, wherein
a first electrode of the first adjustable current source is coupled to a second electrode of the first transistor, and
a first electrode of the second adjustable current source is coupled to a second electrode of the second transistor.

5. The device of claim 1,
a second electrode of the first transistor is coupled to a first electrode of the configurable resistance resistor, and
a second electrode of the second transistor is coupled to the second electrode of the configurable resistance resistor.

6. The device of claim 1, further comprising an AFE configured to generate the AFE output, wherein the AFE output comprises a normal output, and an inverted output comprising an inverted version of the normal output.

7. The device of claim 6, wherein
the inverted output is provided to the first input voltage node of the first compensation circuit, and
the normal output is provided to the second input voltage node of the first compensation circuit.

8. The device of claim 1, wherein the first data slicer comprises:
a first slicer input node coupled to the first output voltage node of the first compensation circuit; and
a second data slicer input node coupled to the second output voltage node of the first compensation circuit.

9. A method for operating a first compensation circuit of a device comprising:
a first compensation circuit configured to adjust an analog front end (AFE) output to generate a first adjusted AFE output;
a first data slicer configured to output a first voltage based on the first adjusted AFE output;
a second compensation circuit configured to adjust the AFE output to generate a second adjusted AFE output; and
a second data slicer configured to output a second voltage based on the second adjusted AFE output,
wherein the first compensation circuit comprises:
a first path between a voltage source and a ground, the first path comprising a first transistor, a first adjustable current source, a first input voltage node configured to receive the AFE output, and a first output voltage node coupled to the first data slicer;
a second path between the voltage source and the ground, the second path comprising a second transistor, a second adjustable current source, a second input voltage node configured to receive the AFE output, and a second output voltage node coupled to the second data slicer; and
a configurable resistance resistor and a configurable capacitance capacitor coupled in parallel across the first path and the second path,
the method comprising adjusting the first adjustable current source and the second adjustable current source to calibrate the first compensation circuit.

10. The method of claim 9, wherein the adjusting the first adjustable current source and the second adjustable current source comprises increasing the first adjustable current source and the second adjustable current source in response to a common mode voltage of the first data slicer being too low.

11. The method of claim 9, wherein the adjusting the first adjustable current source and the second adjustable current source comprises decreasing the first adjustable current source and the second adjustable current source in response to a common mode voltage of the first data slicer being too low.

12. The method of claim 9, wherein the adjusting the first adjustable current source and the second adjustable current source comprises increasing the first adjustable current source and the second adjustable current source in response to a common mode voltage of the first data slicer being too high.

13. The method of claim 9, wherein the adjusting the first adjustable current source and the second adjustable current source comprises increasing the first adjustable current source and decreasing the second adjustable current source, or decreasing the first adjustable current source and increasing the second adjustable current source, in response to a first data slicer input node pair mismatch.

14. The method of claim 9, further comprising adjusting the configurable resistance resistor and the configurable capacitance capacitor to shift a frequency response of the first compensation circuit.

15. A system comprising:
an analog front end (AFE) configured to process an analog input and output an AFE output;
a first compensation circuit coupled to the AFE and configured to adjust the AFE output to generate a first adjusted AFE output;
a first data slicer coupled to the first compensation circuit and configured to output a first voltage based on the first adjusted AFE output;
a second compensation circuit coupled to the AFE and configured to adjust the AFE output to generate a second adjusted AFE output; and
a second data slicer coupled to the AFE and configured to output a second voltage based on the second adjusted AFE output,
wherein the first compensation circuit comprises:
a first path between a voltage source and a ground, the first path comprising a first transistor, a first adjustable current source, a first input voltage node coupled to the AFE, and a first output voltage node coupled to the first data slicer;
a second path between the voltage source and the ground, the second path comprising a second transistor, a second adjustable current source, a second input voltage node coupled to the AFE, and a second output voltage node coupled to the first data slicer; and
a first configurable resistance resistor and a first configurable capacitance capacitor coupled in parallel across the first path and the second path.

16. The system of claim 15, wherein the second compensation circuit comprises:
a third path between a voltage source and a ground, the third path comprising a third transistor, a third adjustable current source, a third input voltage node coupled to the AFE, and a third output voltage node coupled to the second data slicer;
a fourth path between the voltage source and the ground, the fourth path comprising a fourth transistor, a fourth adjustable current source, a fourth input voltage node coupled to the AFE, and a fourth output voltage node coupled to the second data slicer; and
a second configurable resistance resistor and a second configurable capacitance capacitor coupled in parallel across the third path and fourth second path.

17. The system of claim 15, wherein
a first electrode of the first transistor is coupled to the first output voltage node and a gate electrode of the first transistor is coupled to the first input voltage node,
a second electrode of the first transistor is coupled to a first electrode of the first configurable capacitance capacitor,
a first electrode of the second transistor is coupled to the second output voltage node and a gate electrode of the second transistor is coupled to the second input voltage node, and
a second electrode of the second transistor is coupled to a second electrode of the first configurable capacitance capacitor.

18. The system of claim 15, wherein
a first electrode of the first adjustable current source is coupled to a second electrode of the first transistor, and
a first electrode of the second adjustable current source is coupled to a second electrode of the second transistor.

19. The system of claim 15, wherein
a second electrode of the first transistor is coupled to a first electrode of the first configurable resistance resistor, and
a second electrode of the second transistor is coupled to the second electrode of the first configurable resistance resistor.

20. The system of claim 15, wherein
the AFE output comprises a normal output, and an inverted output comprising an inverted version of the normal output,
the inverted output is provided to the first input voltage node of the first compensation circuit, and
the normal output is provided to the second input voltage node of the first compensation circuit.

* * * * *